US011488653B2

(12) United States Patent
Ning

(10) Patent No.: US 11,488,653 B2
(45) Date of Patent: Nov. 1, 2022

(54) POWER SUPPLY SYSTEM AND SEMICONDUCTOR PACKAGE ASSEMBLY

(71) Applicant: Changxin Memory Technologies, Inc., Anhui (CN)

(72) Inventor: Shu-Liang Ning, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/211,693

(22) Filed: Mar. 24, 2021

(65) Prior Publication Data

US 2021/0210134 A1 Jul. 8, 2021

Related U.S. Application Data

(63) Continuation of application No. PCT/CN2019/108056, filed on Sep. 26, 2019.

(30) Foreign Application Priority Data

Sep. 27, 2018 (CN) .......................... 201811132407.4
Sep. 27, 2018 (CN) .......................... 201821581736.2

(51) Int. Cl.
*G11C 11/40* (2006.01)
*G11C 11/4074* (2006.01)
(Continued)

(52) U.S. Cl.
CPC .......... *G11C 11/4074* (2013.01); *H01L 24/13* (2013.01); *H01L 24/16* (2013.01);
(Continued)

(58) Field of Classification Search
None
See application file for complete search history.

(56) References Cited

U.S. PATENT DOCUMENTS

| 9,722,597 | B2 | 8/2017 | Lee | |
|---|---|---|---|---|
| 2006/0233012 | A1* | 10/2006 | Sekiguchi | G11C 5/02 365/51 |
| 2008/0205183 | A1 | 8/2008 | Hwang et al. | |
| 2011/0235456 | A1* | 9/2011 | Jin | G11C 5/02 365/230.03 |
| 2012/0099392 | A1* | 4/2012 | Shim | G11C 5/147 365/226 |

(Continued)

FOREIGN PATENT DOCUMENTS

| CN | 109147834 A | 1/2019 |
|---|---|---|
| CN | 109147835 A | 1/2019 |

OTHER PUBLICATIONS

PCT International Search Report and the Written Opinion dated Jan. 8, 2020, issued in related International Application No. PCT/CN2019/108056 (8 pages).

*Primary Examiner* — Tan T. Nguyen
(74) *Attorney, Agent, or Firm* — Sheppard Mullin Richter & Hampton LLP

(57) ABSTRACT

An electronic device and a semiconductor package structure are provided. The electronic device includes a plurality of semiconductor dies stacked vertically over each other and a power supply system. The plurality of semiconductor dies are stacked over the power supply system, and the power supply system includes: a voltage generating circuit configured to generate at least one voltage; and a die enabling circuit configured to generate a die enable signal according to the at least one voltage. The at least one voltage is provided to the plurality of semiconductor dies through a power interconnecting structure, and the die enable signal is configured to enable synchronous input of the at least one voltage to the plurality of semiconductor dies.

20 Claims, 8 Drawing Sheets

(51) Int. Cl.
*H01L 23/00* (2006.01)
*H01L 25/065* (2006.01)

(52) U.S. Cl.
CPC .............. *H01L 24/17* (2013.01); *H01L 24/48* (2013.01); *H01L 25/0657* (2013.01); *H01L 2224/13025* (2013.01); *H01L 2224/16146* (2013.01); *H01L 2224/16225* (2013.01); *H01L 2224/17181* (2013.01); *H01L 2224/48227* (2013.01); *H01L 2225/0651* (2013.01); *H01L 2225/06513* (2013.01); *H01L 2225/06517* (2013.01); *H01L 2225/06527* (2013.01); *H01L 2225/06541* (2013.01); *H01L 2225/06565* (2013.01); *H01L 2924/1436* (2013.01)

(56) References Cited

U.S. PATENT DOCUMENTS

| | | | |
|---|---|---|---|
| 2012/0250443 A1 | 10/2012 | Saraswat et al. | |
| 2013/0070540 A1* | 3/2013 | Pyeon | G11C 5/147 327/564 |
| 2013/0301372 A1* | 11/2013 | Park | G11C 7/22 365/227 |
| 2014/0104953 A1* | 4/2014 | Itakura | H01L 25/16 438/15 |
| 2015/0162068 A1* | 6/2015 | Woo | G11C 8/12 365/222 |
| 2015/0168972 A1* | 6/2015 | Mathiyalagan | H01L 23/50 327/540 |
| 2016/0141005 A1* | 5/2016 | Lee | G11C 5/148 365/226 |
| 2016/0141015 A1* | 5/2016 | Lee | G11C 11/4087 365/226 |

* cited by examiner

POWER SUPPLY SYSTEM AND SEMICONDUCTOR PACKAGE ASSEMBLY

CROSS-REFERENCE TO RELATED APPLICATIONS

This application is a continuation application of International Patent Application No. PCT/CN2019/108056, filed on Sep. 26, 2019, which is based on and claims priority of the Chinese Patent Application Nos. 201811132407.4 and 201821581736.2, both filed on Sep. 27, 2018. The above-referenced applications are incorporated herein by reference in their entirety.

TECHNICAL FIELD

The present disclosure relates generally to the technical field of semiconductor technologies and, more specifically, to a power supply system and a semiconductor package structure.

BACKGROUND

With the technical advancement in mobile consumer electronic devices, such as cellular phones, notebook computers and personal digital assistants, the demand for memory devices with compact structures and high performance has substantially increased. Modern developments in semiconductor memory devices can be viewed as a process of maximizing the storage capacity at the smallest area on a memory device at a specific operating speed. In this context, the term "smallest" generally refers to the smallest area occupied by a memory device in a "horizontal" X/Y plane (e.g., a plane defined by a main surface of a printed circuit board or template board). In general, the allowable horizontal area occupied by the memory device is limited, thus memory devices with vertically integrated structure are developed so that the storage capacity of the devices may be further increased.

It is to be understood that the above information is only used to facilitate understanding the background of the present disclosure, and thus may include information that does not constitute prior art known to a person of ordinary skill in the art.

SUMMARY

One aspect of the present disclosure is directed to an electronic device. The device may comprise a plurality of semiconductor dies and a power supply system. The power supply system may include a voltage generating circuit configured to generate at least one voltage and a die enable circuit configured to generate a die enable signal according to the at least one voltage.

The voltage generating circuit may include at least one voltage regulator configured to generate the at least one voltage. The at least one voltage may be provided to the plurality of semiconductor dies through a power interconnecting structure, and the die enable signal may be configured to enable synchronous input of the at least one voltage to the plurality of semiconductor dies.

In some embodiments of the present disclosure, the at least one voltage may be an internal voltage for the plurality of semiconductor dies.

In some embodiments of the present disclosure, the plurality of semiconductor dies may be stacked over each other.

In some embodiments of the present disclosure, the die enable circuit may comprise at least one voltage detection circuit and an AND gate circuit. Each of the at least one voltage detection circuit may be configured to detect a corresponding one of the at least one voltage, and an input of each of the at least one voltage detection circuit may be connected to a corresponding one of the at least one voltage. An output of each of the at least one voltage detection circuit may be connected to an input of the AND gate circuit, and an output of the AND gate circuit may be configured to output the die enable signal.

In some embodiments of the present disclosure, the at least one voltage regulator may include a first charge pump circuit, a second charge pump circuit, a third charge pump circuit, a first low dropout linear regulator, a second low dropout linear regulator, and a third low dropout linear regulator. The first charge pump circuit, the second charge pump circuit, and the third charge pump circuit may be configured to output, respectively, a first voltage, a second voltage, and a third voltage according to an external voltage.

The first low dropout linear regulator, the second low dropout linear regulator, and the third low dropout linear regulator may be configured to output, respectively, a fourth voltage, a fifth voltage, and a sixth voltage according to the external voltage. The first voltage may be larger than the external voltage, and the second voltage and the third voltage may both be opposite to the external voltage in polarity. The fourth voltage, the fifth voltage, and the sixth voltage may each be less than or equal to the external voltage.

In some embodiments of the present disclosure, in the aforementioned devices, the power supply system may further comprise a reference voltage generating circuit configured to generate a reference voltage. The at least one voltage regulator may be configured to output, respectively, the first voltage, the second voltage, the third voltage, the fourth voltage, the fifth voltage, and the sixth voltage according to the external voltage, the reference voltage, and a power enable signal.

In some embodiments of the present disclosure, the at least one voltage regulator may include a first low dropout linear regulator, a first charge pump circuit, a second charge pump circuit, a second low dropout linear regulator, a third low dropout linear regulator, and a fourth low dropout linear regulator.

The first low dropout linear regulator, the second low dropout linear regulator, the third low dropout linear regulator, and the fourth low dropout linear regulator may be configured to output, respectively, a first voltage, a fourth voltage, a fifth voltage, and a sixth voltage according to an external voltage. The first charge pump circuit and the second charge pump circuit may be configured to output, respectively, a second voltage and a third voltage according to the external voltage. The first voltage, the fourth voltage, the fifth voltage, and the sixth voltages may each be less than or equal to the external voltage. The second voltage and the third voltage may both be opposite to the external voltage in polarity.

Another aspect of the present disclosure is directed to a semiconductor package structure. The semiconductor package structure may include a package substrate, at least one semiconductor die disposed on the package substrate, and the power supply system of any of the aforementioned embodiments. The power supply system may be disposed on the package substrate.

In some embodiments of the present disclosure, in the aforementioned semiconductor package structure, the at least one semiconductor die may comprise a plurality of semiconductor dies, each having a same electrical function.

In some embodiments of the present disclosure, in the aforementioned semiconductor package structure, the plurality of semiconductor dies may be memory dies.

In some embodiments of the present disclosure, in the aforementioned semiconductor package structure, the plurality of semiconductor dies may be dynamic random-access memory (DRAM) dies.

In some embodiments of the present disclosure, in the aforementioned semiconductor package structure, the plurality of semiconductor dies may be stacked vertically on the power supply system.

In some embodiments of the present disclosure, in the aforementioned semiconductor package structure, the power interconnecting structure may comprise a through silicon via (TSV).

In some embodiments of the present disclosure, in the aforementioned semiconductor package structure, the plurality of semiconductor dies may be individually disposed on the package substrate directly, and the power supply system may be directly disposed on the package substrate.

In some embodiments of the present disclosure, in the aforementioned semiconductor package structure, the power interconnecting structure may comprise a metal wire.

In some embodiments of the present disclosure, in the aforementioned semiconductor package structure, the plurality of semiconductor dies may be vertically stacked on the package substrate, and the power supply system may be directly disposed on the package substrate.

In some embodiments of the present disclosure, in the aforementioned semiconductor package structure, a diameter of the power interconnecting structure may depend on a number of the at least one semiconductor die.

In some embodiments of the present disclosure, the aforementioned semiconductor package structure may further comprise a signal interconnecting structure. The signal interconnecting structure may be configured to input an external control signal to each of the at least one semiconductor die and/or input a data signal to or receive a data signal from each of the at least one semiconductor die through the package substrate.

In some embodiments of the present disclosure, in the aforementioned semiconductor package structure, each of the at least one semiconductor die and the power supply system may share a ground power source provided by the package substrate.

In some embodiments of the present disclosure, in the aforementioned semiconductor package structure, a package size of the power supply system may be smaller than or equal to a package size of each of the at least one semiconductor die.

BRIEF DESCRIPTION OF THE DRAWINGS

The various objectives features and advantages of the present disclosure will become more apparent after reading the Detailed Description of the Embodiments in view of the accompanying drawings. The drawings are only illustrative diagrams of the present disclosure and are not necessarily drew to scale. In the drawings, the same reference indicates the same or similar parts.

DETAILED DESCRIPTION OF THE EMBODIMENTS

Exemplary embodiments embodying the features and advantages of the present disclosure will be described in detail in the following description. It should be understood that the present disclosure can be modified based on various embodiments, which will not go beyond the scope of the present disclosure. Description and Drawings are not used for limiting but illustrating the present disclosure.

In the following description of the various exemplary embodiments of the present disclosure, reference is made to the drawings which are parts of the disclosure, and some different exemplary structures, systems and steps according to various aspects of the disclosure are provided. It is understood that other specific components, structures, exemplary devices, systems and steps may be employed, and structural and functional modifications may be made without departing from the scope of the disclosure.

Figure 1:
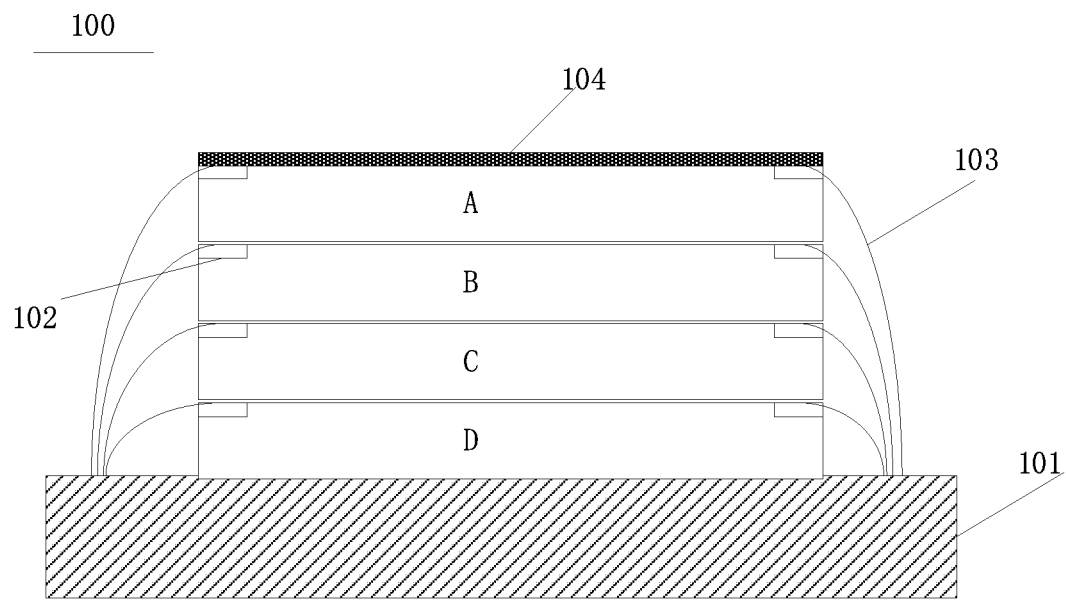
FIG. 1 is a schematic structural diagram of a semiconductor package structure in the related art.

FIG. 1 is a schematic structural diagram of a semiconductor package structure in the related art.

As shown in FIG. 1, a plurality of semiconductor dies (for example, the semiconductor memory dies A-D in FIG. 1) may be vertically stacked in a vertical plane Z relative to a horizontal plane X/Y. For example, the die A may be arranged on top of the die B, the die B may be arranged on top of the die C, and the die C may be arranged on top of the die D.

A stacked semiconductor package structure may be one type of three-dimensional (3D) integrated circuit (IC). In other words, from a perspective of other systems (such as memory controllers), 3D memory devices may act as integrated memory devices. The data writing and reading operations may be performed by the 3D memory device so that data writing and reading methods that are generally applicable to non-stacked memory devices (i.e., 2D memory devices) may be used for 3D memory devices. Compared to non-stacked memory devices, 3D memory devices are capable of storing and providing a larger amount of data on a unit area of horizontal surface area.

As shown in FIG. 1, a semiconductor package structure 100 having a plurality of stacked semiconductor dies may include a package substrate 101 and semiconductor dies A-D which are stacked on the package substrate 101 successively.

Each semiconductor die may have a peripheral region on which electrode pads 102 may be disposed. The electrode pads 102 of the semiconductor dies A-D may be interconnected with electrode pads (not shown) on the package substrate 101 by bonding wires 103.

In the semiconductor package structure 100 shown in FIG. 1, the width of each electrode pad 102 should satisfy certain requirements in order to achieve a reliable connection between the bonding wire 103 and the electrode pad 102. In addition, the distance between neighboring electrode pads 102 (the pitch) cannot be too small. As a result, the number of electrode pads 102 provided on the semiconductor die may be limited. Moreover, the bonding wires 103 increase the total horizontal area occupied by the stacked devices, and an intermediate layer, such as a Re-Distribution Layer (RDL) 104, may need to be provided between adjacent semiconductor dies in the stack.

If the semiconductor dies A-D are Dynamic Random Access Memory (DRAM) dies, a large number of signal terminals, such as the address signal terminal, command signal terminal and data line terminal, should be provided with electrode pads 102, in addition to the power supply terminal and the ground terminal. Therefore, the number of electrode pads 102 that can be assigned to the power supply terminal and the ground terminal may be limited.

Figure 2:
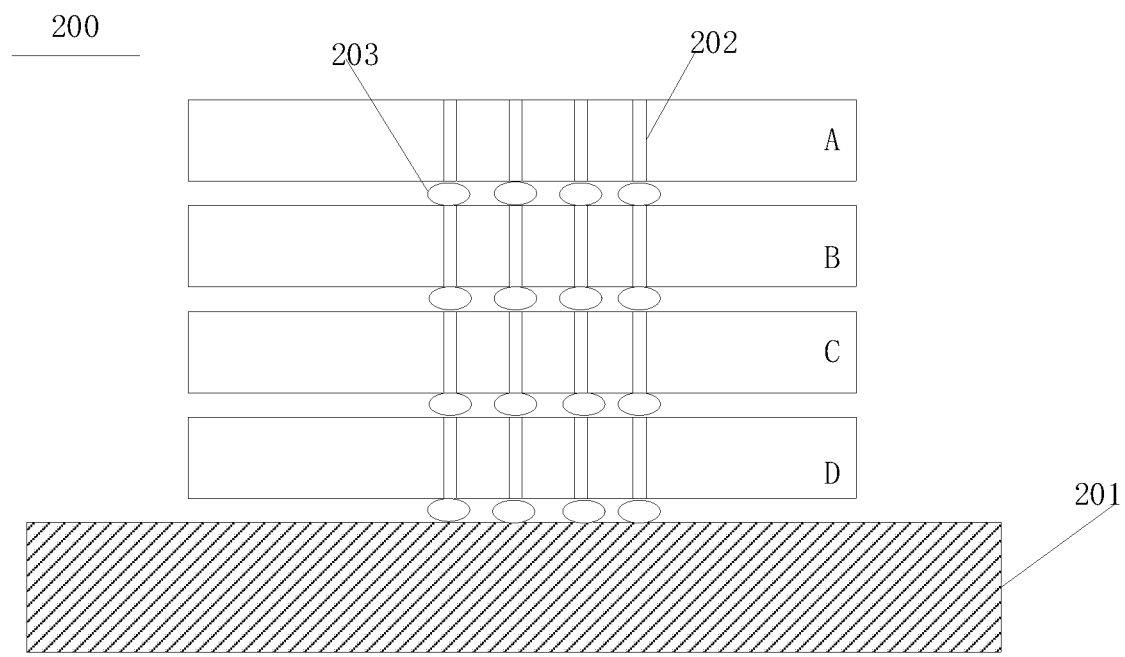
FIG. 2 is a schematic structural diagram of another semiconductor package structure in the related art.

FIG. 2 is a schematic structural diagram of another semiconductor package structure in the related art.

In FIG. 2, a 3D integrated circuit based on Through Silicon Via (TSV) is formed by vertically stacking multiple layers of dies with TSVs therethrough to achieve interconnection between dies for data communication. Thus, in addition to the horizontal area defined by the periphery of the largest die in the stack, no additional horizontal area needs to be occupied. In addition, TSVs may reduce the overall length of certain signal paths through the stacked structure of devices, thus helping to speed up operations. Thus, with the use of TSVs or similar stacking processes, devices, such as memory devices, formed by multiple vertically stacked dies can use a single integrated circuit with a relatively small horizontal surface area to store and provide large amounts of data.

As shown in FIG. 2, the semiconductor package structure 200 may have a plurality of semiconductor dies A-D of the same size. The plurality of semiconductor dies A-D may be stacked one above another through a plurality of TSVs 202 and electrode pads 203, thereby achieving electrical connection between the semiconductor dies. This technique can reduce the size of the semiconductor package structure since it is not necessary to provide solder pads for each bonding wire.

The semiconductor package structure 200 of FIG. 2 may be a DRAM device. Specifically, the semiconductor package structure 200 may include a package substrate 201 and four DRAM dies A-D successively stacked on the package substrate 201. In the DRAM dies and the peripheral regions of the package substrate 201, a plurality of TSVs 202 may be formed passing through the semiconductor dies from the top DRAM die to the bottom DRAM die along the Z direction.

Figure 3:
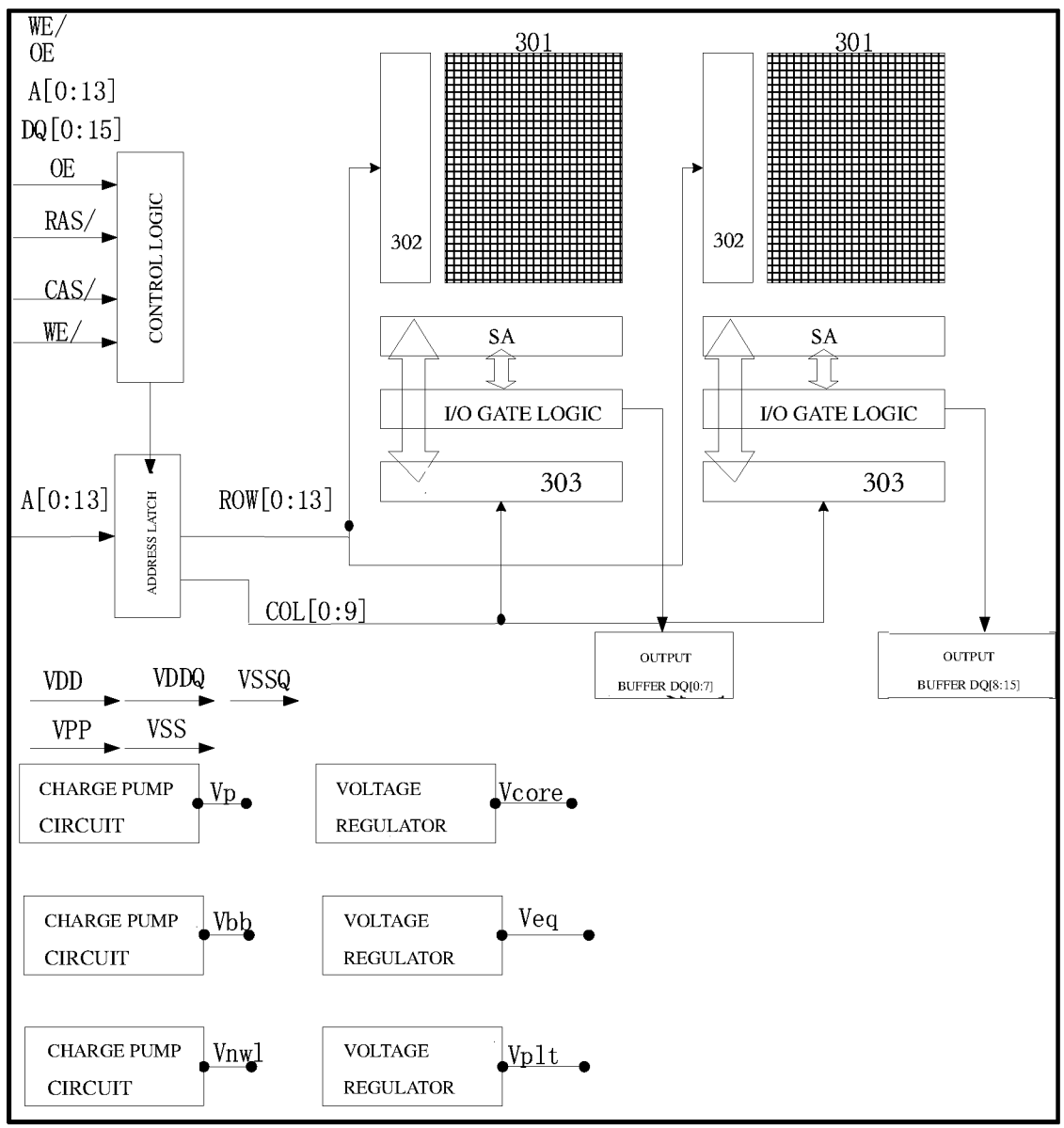
FIG. 3 is a schematic structural diagram of a semiconductor die in the related art.

FIG. 3 is a schematic structural diagram of a semiconductor die in the related art.

FIG. 3 is a schematic diagram of a single layer of DRAM die in the semiconductor package structure 200 as shown in FIG. 2. The DRAM dies A-D in FIG. 2 may each have the same ports or pins. For example, these ports or pins may include: BA0-2 (Bank Sel), A0-15 (Address signal), RAS/, CAS/, WE/(Command control signal), CLK, CLK/(clock signal), CS/, RESET/(reset signal), DQ[0:15] (data signal), and signals of the external power supplies VDD, VDDQ, VSS, VSSQ, VPP, etc. These ports or pins may be connected to the TSVs, metal wires or RDLs and may also be connected to package balls (PINs).

Each of the control signals or address signals, such as Bank Sel, Address, Command, CLK, RESET/, may be electrically connected to and pass through each layer of the DRAM dies A-D. Signals of the external power supplies such as VDD, VDDQ, VSS, VSSQ, and VPP may be each electrically connected to and pass through each layer of the DRAM dies A-D.

DRAM memory cell array 301 may include a plurality of single memory cells arranged corresponding to a matrix formed by signal lines arranged in rows and columns. Each memory cell may be capable of storing "write data" in response to a write command and providing "read data" in response to a read command received from an external device (not shown), such as a memory controller or processor. The read or write commands may generate certain control signals (e.g., row address, column address, enable signal, etc.), which may be applied to, along with certain control voltages, the memory cell array 301 through associated peripheral devices (e.g., row decoder 302 and column decoder 303).

During a write operation, the "write data" (i.e., data to be stored in memory cell array 301) may be transmitted from an external circuit (e.g., external memory, external input device, processor, memory controller, memory switch, etc.) to a data register. Once stored in the data register, the "write data" may be written into the memory cell array 301 by conventional structures and techniques, which may include, for example, sense amplifiers and write driver circuits.

During a read operation, the applied control voltage and the control signal outputs from row decoders 302 and column decoders 303 may typically cooperate to identify and select one or more memory cells in the memory cell array 301 and facilitate providing signals indicating the value of the data stored in the memory cells. The resulting "read data" may typically be transmitted by a read sense amplifier and stored in a data register. The "read data" stored in the data register then may be supplied to external circuits under the control of the read control circuit.

As shown in FIG. 3, each layer of DRAM dies in FIG. 2 may include all logical blocks related to the DRAM operations, such as write/read control logic, refresh control, and power supply (e.g., Vp, Vbb, Vnwl, Vcore, Veq, Vplt, etc.).

The power supply may need to be adjusted by the corresponding charge pump circuit or voltage regulator to obtain a desired voltage level.

Each layer of the DRAM dies in the semiconductor package structure 200 shown in FIG. 2 may include a respective charge pump circuit and a voltage regulator. That is, the DRAM dies A-D may each have the same internal power supply circuit. Since the DRAM dies may need to be fabricated by advance nano-scale processes, and the power supply dies (Power IC) generally can be fabricated by micro-scale processes, the difference between the two processes, in term of feature size, may be up to 1000 times. If the power supply die is integrated in the DRAM dies, the efficiency of the power supply die may reduce (e.g., from 90% to 60% or so) since the manufacturing process for the DRAM dies may not be suitable for the power supply die. In addition, integrating the power supply die into the DRAM dies will occupy the die area and increase the cost of the DRAM dies. Moreover, the manufacturing process of the DRAM dies is an expensive process, while the manufacturing process of the power supply is relatively low in cost.

Figure 4:
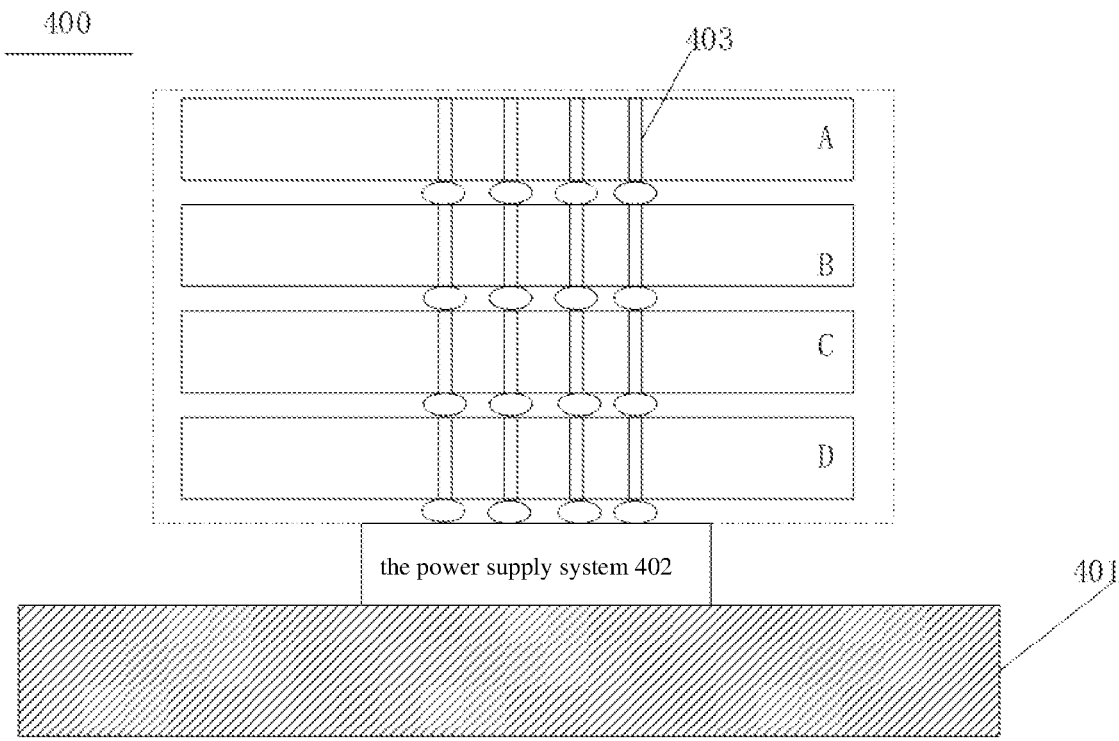
FIG. 4 is a schematic structural diagram of a semiconductor package structure in accordance with one embodiment of the present disclosure.

FIG. 4 is a schematic structural diagram of a semiconductor package structure in accordance with one embodiment of the present disclosure.

As shown in FIG. 4, this disclosure provides a semiconductor package structure 400. The semiconductor package structure 400 may include: a package substrate 401; a power supply system 402 which may be disposed on the package substrate 401; and at least one semiconductor die. In this embodiment, four semiconductor dies A-D may be provided as an example, but the number of dies can be adjusted according to specific needs, and the present disclosure is not limited thereto.

In some embodiments, the at least one semiconductor die may include a plurality of semiconductor dies, and each of the plurality of semiconductor dies may have same electrical functions.

In some embodiments, the plurality of semiconductor dies may be memory dies.

In some embodiments, the plurality of semiconductor dies may be DRAM dies. The semiconductor die, however, may be any type of die, and this disclosure is not limited thereto.

In the embodiment shown in FIG. 4, the plurality of semiconductor dies may be vertically stacked on the power supply system 402 successively. For example, the DRAM die A may be vertically stacked on the DRAM die B, and the DRAM die B may be vertically stacked on the DRAM die C, and the DRAM die C may be vertically stacked on the DRAM die D.

In the embodiment shown in FIG. 4, the power supply system 402 may send, through TSVs 403 acting as power interconnecting structures, the internal voltages to the respective semiconductor dies.

It should be noted that FIG. 4 only shows one embodiment in which a plurality of semiconductor dies are vertically and successively stacked on the power supply system. In other embodiments, each of the plurality of semiconductor dies may be directly disposed on the package substrate 401. That is, the semiconductor dies may be arranged adjacent to each other in the horizontal plane of the package substrate 401 (i.e., side-by-side arrangement), and the power supply system may also be directly disposed on the package substrate 401. In other embodiments, the plurality of semiconductor dies may be vertically and successively stacked on the package substrate 401, and the power supply system may be directly disposed on the package substrate 401.

In the embodiments in which the semiconductor dies are arranged adjacent to each other in the horizontal plane of the package substrate 401, the power supply system 402 may send, through metal wires acting as power interconnecting structures, the internal voltages to the respective semiconductor dies.

Figure 5:
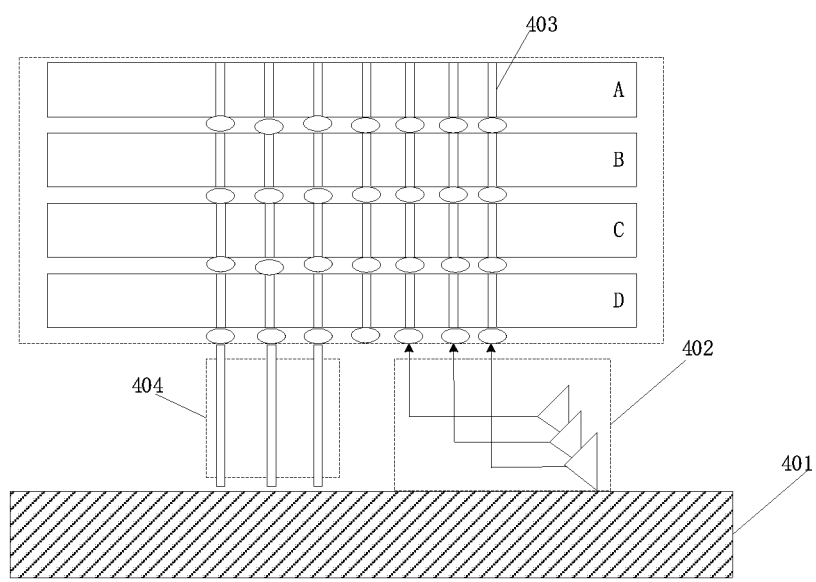
FIG. 5 is a schematic structural diagram of another semiconductor package structure in accordance with one embodiment of the present disclosure.

FIG. 5 is a schematic structural diagram of another semiconductor package structure in accordance with one embodiment of the present disclosure.

As shown in FIG. 5, at least one internal voltage output from the power supply system 402 may be input to each layer of the DRAM dies A-D through the corresponding TSVs 403, respectively. Three arrows are shown in FIG. 5 are for illustration purpose only and are not intended to limit the amount of internal voltages that may be output by power supply system 402.

In some embodiments, the diameter of the power interconnecting structure may depend on the number of the at least one semiconductor die. For example, the larger the number of the semiconductor dies stacked on the power supply system 402, the larger the diameter of the corresponding TSV 403 may be. The higher the layer of the semiconductor dies to which the TSV 403s need to transmit the signal, the larger the voltage drop will be. In this case, the voltage drop may be decreased by increasing the diameter of the TSVs 403 or the number of TSVs 403 connected in parallel, so that the values of the same internal voltage received by the respective layers of the semiconductor dies may be substantially the same.

In the embodiment shown in FIG. 5, each TSV 403 may have a diameter of, for example, about 20 μm and may be arranged at a pitch of about 50 μm, which is sufficient to prevent short-circuit failure between adjacent TSVs. However, the diameters and pitches can be reduced with the possible development of TSV technology.

Referring to FIG. 5, the semiconductor package structure may further include: a signal interconnecting structure 404, which may be configured to input external control signals (e.g., Address, Command, etc.) to each of the semiconductor dies and/or input data signal (e.g., DQ [0-15]) to or output data signal (e.g., DQ [0-15]) from each of the semiconductor dies through the package substrate 401. In the embodiment of the present disclosure, the signal interconnecting structure 404 may also be a TSV.

In the embodiment shown in FIG. 5, each of the semiconductor dies A-D and the power supply system 402 may share a ground power source (not shown) provided by the package substrate 401.

In some embodiments, a package size of the power supply system may be less than or equal to a package size of each of the semiconductor dies.

For example, in the embodiments shown in FIGS. 4 and 5, the package size of the power supply system 402 may be smaller than the package size of each of the semiconductor dies A-D.

Figure 6:
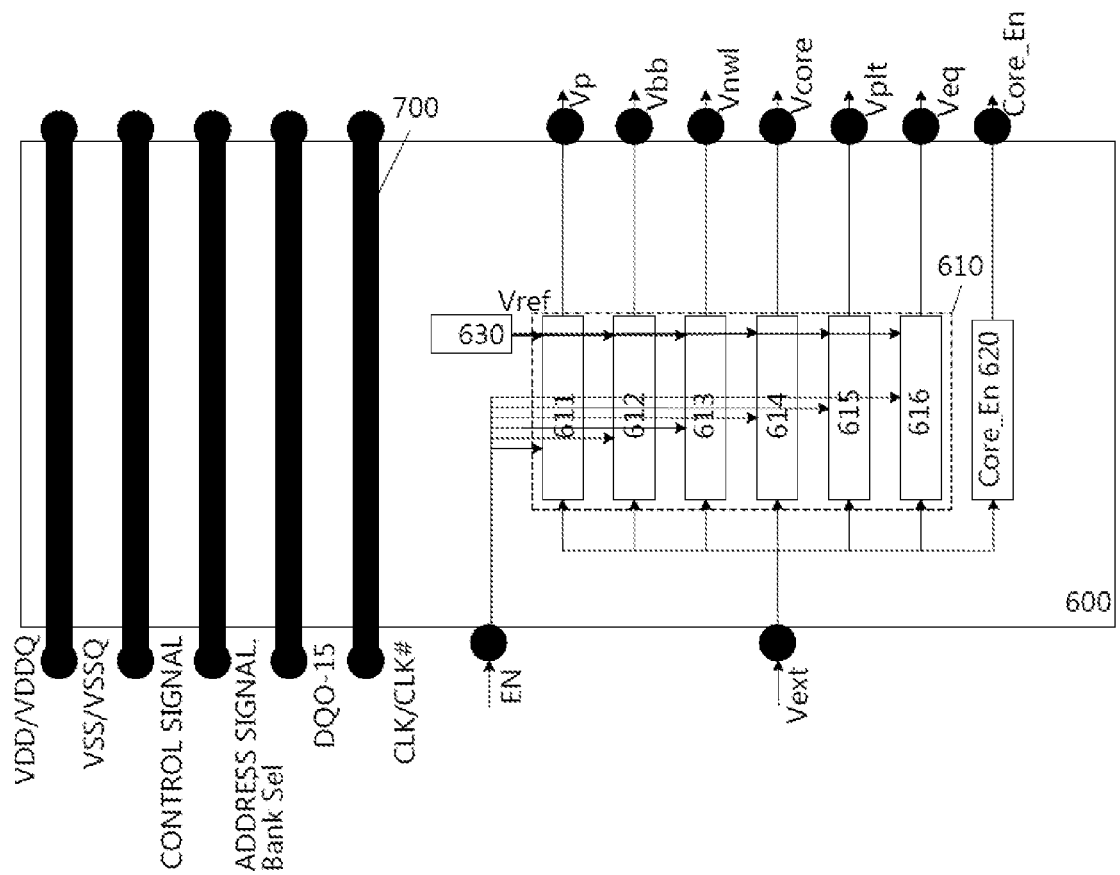
FIG. 6 is a schematic structural diagram of a power supply system in accordance with one embodiment of the present disclosure.

FIG. 6 is a schematic structural diagram of a power supply system in accordance with one embodiment of the present disclosure.

As shown in FIG. 6, this disclosure provides a power supply system 600. The power supply system 600 may include an internal voltage generating circuit 610, which may be configured to generate at least one internal voltage. The at least one internal voltage may be provided to at least one semiconductor die (such as the DRAM die in the aforementioned embodiments, but the disclosure is not limited thereto) through a power interconnecting structure (such as a TSV or bonding wire). The power supply system

600 may further comprise a circuit 620, which may be configured to generate a die enable signal Core_En according to the at least one internal voltage. The die enables signal Core_En may be configured to enable synchronous input of the at least one internal voltage to the at least one semiconductor die.

In some embodiments, the internal voltage generating circuit 610 may include at least one voltage regulator configured to generate the at least one internal voltage.

In some embodiments, the at least one voltage regulator may include a first charge pump circuit, a second charge pump circuit, a third charge pump circuit, a first low dropout linear regulator, a second low dropout linear regulator and a third low dropout linear regulator. The first charge pump circuit, the second charge pump circuit, and the third charge pump circuit may be configured to output, respectively, a first internal voltage, a second internal voltage, and a third internal voltage according to an external voltage. The first low dropout linear regulator, the second low dropout linear regulators and the third low dropout linear regulator may be configured to output, respectively, a fourth internal voltage, a fifth internal voltage, and a sixth internal voltage according to the external voltage. The first internal voltage may be larger than the external voltage, the second internal voltage and the third internal voltage may both be opposite to the external voltage in polarity. The fourth internal voltage, the fifth internal voltage, and the sixth internal voltage may each be less than or equal to the external voltage.

In some embodiments, a Low Dropout Regulator (LDO) may use a transistor or a Field Effect Transistor (FET) operating in its linear region to subtract the excess from the applied input voltage to produce a regulated output voltage. LDO has outstanding advantages in that it is cost-effective and has little noise and quiescent current. Moreover, LDO requires very few external components. For example, a LDO usually only requires one or two bypass capacitors. Thus a LDO may achieve high efficiency in cases in which the input voltage and the output voltage are very close. In such cases, the input current of the LDO is substantially equal to the output current. If the voltage drop (the difference between the output voltage and the input voltage) is large, the energy consumed by the LDO may be large and the efficiency may deteriorate. In other embodiments, the LDO in the embodiment of the present disclosure may also be replaced by a DC-DC converter according to actual needs.

In the embodiment shown in FIG. 6, as an example, the semiconductor dies may be DRAM dies, and it is assumed that each layer of the DRAM dies requires six internal voltages, which are Vp, Vbb, Vnwl, Vcore, Vplt, and Veq. The at least one voltage regulator may include a first charge pump circuit 611, a second charge pump circuit 612, a third charge pump circuit 613, a first low dropout linear regulator 614, a second low dropout linear regulator 615, and a third low dropout linear regulator 616. The first charge pump circuit 611 may be configured to output the first internal voltage Vp according to the external voltage Vext. The second charge pump circuit 612 may be configured to output the second internal voltage Vbb according to the external voltage Vext. The third charge pump circuit 613 may be configured to output the third internal voltage Vnwl according to the external voltage Vext. The first low dropout linear regulator 614 may be configured to output a fourth internal voltage Vcore according to the external voltage Vext. The second low dropout linear regulator 615 may be configured to output the fifth internal voltage Vplt according to the external voltage Vext. The third low dropout linear regulator 616 may be configured to output the sixth internal voltage Veq according to the external voltage Vext.

In some embodiments, the first internal voltage Vp may be larger than the external voltage Vext, and the second internal voltage Vbb and the third internal voltage Vnwl may be opposite to the external voltage Vext in polarity. For example, these voltages may have the following values: Vext=1.2V, Vp=3.0V, Vbb=−0.5V, Vnwl=−0.3V. The above voltage values are for illustrative purposes only, and the disclosure is not limited thereto.

It should be noted that when the input voltage is opposite to the output voltage in polarity, the inverter in the corresponding charge pump can convert the input positive voltage into the output negative voltage.

In some embodiments, the fourth internal voltage Vcore, the fifth internal voltage Vplt, and the sixth internal voltage Veq may each be less than or equal to the external voltage Vext. For example, these voltages may have the following values: Vext=1.2V, Vcore=1.0V, and Vplt=Veq=0.5V. The disclosure is not limited thereto though.

In some embodiments, the at least one voltage regulator may include a first low dropout linear regulator, a first charge pump circuit, a second charge pump circuit, a second low dropout linear regulator, a third low dropout linear regulator, and a fourth low dropout linear regulator. The first low dropout linear regulator, the second low dropout linear regulator, the third low dropout linear regulator, and the fourth low dropout linear regulator may be configured to output, respectively, a first internal voltage, a fourth internal voltage, a fifth internal voltage, and a sixth internal voltage according to an external voltage. The first charge pump circuit and the second charge pump circuit may be configured to output, respectively, a second internal voltage and a third internal voltage according to the external voltage. The first internal voltage, the fourth internal voltage, the fifth internal voltage, and the sixth internal voltage may each be less than or equal to the external voltage. Both the second internal voltage and the third internal voltage may be opposite to the external voltage in polarity.

Taking FIG. 6 as an example, assuming that each layer of the semiconductor dies requires six internal voltages, which are Vp, Vbb, Vnwl, Vcore, Vplt, and Veq. The at least one voltage regulator may include the first low dropout linear regulator 611, the first charge pump circuit 612, the second charge pump circuit 613, the second low dropout linear regulator 614, the third low dropout linear regulator 615, and the fourth low dropout linear regulator 616. The first low dropout linear regulator 611 may be configured to output the first internal voltage Vp according to the external voltage Vext. The first charge pump circuit 612 can be configured to output a second internal voltage Vbb according to the external voltage Vext. The second charge pump circuit 613 can be configured to output a third internal voltage Vnwl according to the external voltage Vext. The second low dropout linear regulator 614 can be configured to output a fourth internal voltage Vcore in accordance with the external voltage Vext. The third low dropout linear regulator 615 may be configured to output the fifth internal voltage Vplt according to the external voltage Vext. The fourth low dropout linear regulator 616 may be configured to output the sixth internal voltage Veq according to the external voltage Vext.

In some embodiments, the first internal voltage Vp, the fourth internal voltage Vcore, the fifth internal voltage Vplt and the sixth internal voltage Veq each may be less than or equal to the external voltage Vext. For example, these voltages may have the following values: Vext>3.3V, Vp=3.0V, Vcore=1.0V, Vplt=Veq=0.5V. The second internal voltage Vbb and the third internal voltage Vnwl may each be opposite to the external voltage Vext in polarity. For example, these voltages may have the following values: Vext>3.3V, Vbb=−0.5V, Vnwl=−0.3V.

Referring back to FIG. 6, the power supply system 600 may further include a reference voltage generating circuit 630 that may be configured to generate the reference voltage Vref.

In the embodiment shown in FIG. 6, each voltage regulator may be configured to output, respectively, the first internal voltage Vp, the second internal voltage Vbb, the third internal voltage Vnwl, the fourth internal voltage Vcore, the fifth internal voltage Vplt, and the sixth internal voltage Veq according to the external voltage Vext, the reference voltage Vref and the power enable signal EN.

In the embodiment shown in FIG. 6, the semiconductor package structure including the power supply system 600 may further include a signal interconnecting structure 700. The signal-die interconnection structure 700 may be configured to input external control signals (e.g., the external voltage VDD/VDDQ, VSS/VSSQ, the address signal Address, the command signal Command, the clock signal CLK or /CLK, etc.) to each of the semiconductor dies and/or input data signal (e.g., DQ [0-15]) to or output data signal (e.g., DQ [0-15]) from each of the semiconductor dies through the package substrate (not shown) of the semiconductor package structure. In the embodiment of the present disclosure, the signal interconnecting structure 700 may also be a TSV.

It should be noted that the embodiment shown in FIG. 6 is described using an example in which the semiconductor die of the semiconductor package structure is a DRAM die. In other embodiments, the semiconductor die of the semiconductor package structure may be other type of die. Correspondingly, the number and type of internal voltages generated by the internal voltage generating circuit may also be changed accordingly. Similarly, the external control signals and/or data signals provided by the signal interconnecting structure may also be changed accordingly.

Figure 7:
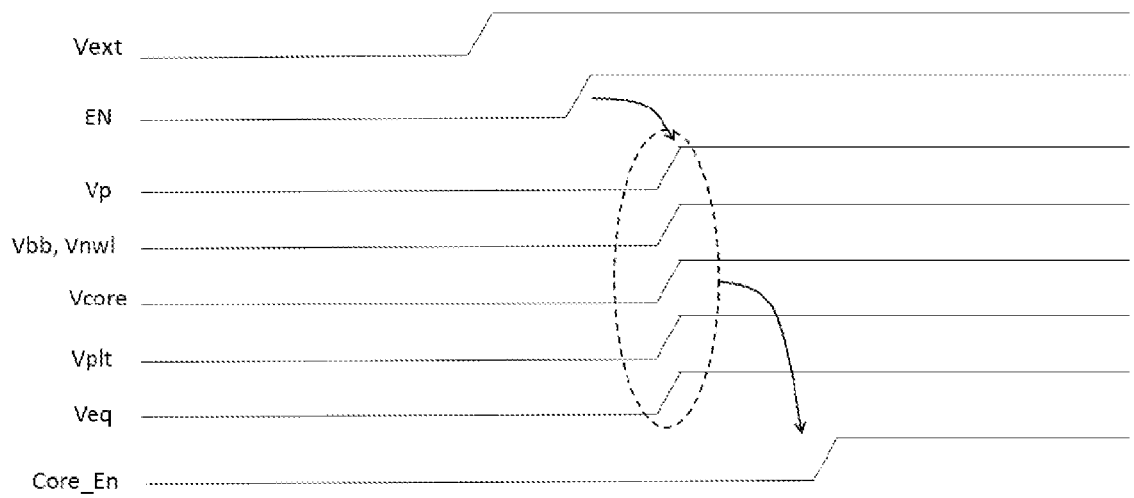
FIG. 7 is a sequence diagram of the power supply system shown in FIG. 6.

FIG. 7 is a sequence diagram of the power supply system shown in FIG. 6.

As shown in FIG. 7, when only the external voltage Vext is at a high level, the internal voltage generating circuit will not work until the power enable signal EN is also at a high level. When both Vext and EN are at a high level, the internal voltage generating circuit begins to work. After a certain delay, the internal voltage generating circuit may output, respectively, the first internal voltage Vp, the second internal voltage Vbb, the third internal voltage Vnwl, the fourth internal voltage Vcore, the fifth internal voltage Vplt, and the sixth internal voltage Veq.

Since there may exist delays when outputting the high levels for various internal voltages (i.e., the high levels of various internal voltages may not be output synchronously), the die enable signal Core_En may be added to synchronize these internal voltages.

Figure 8:
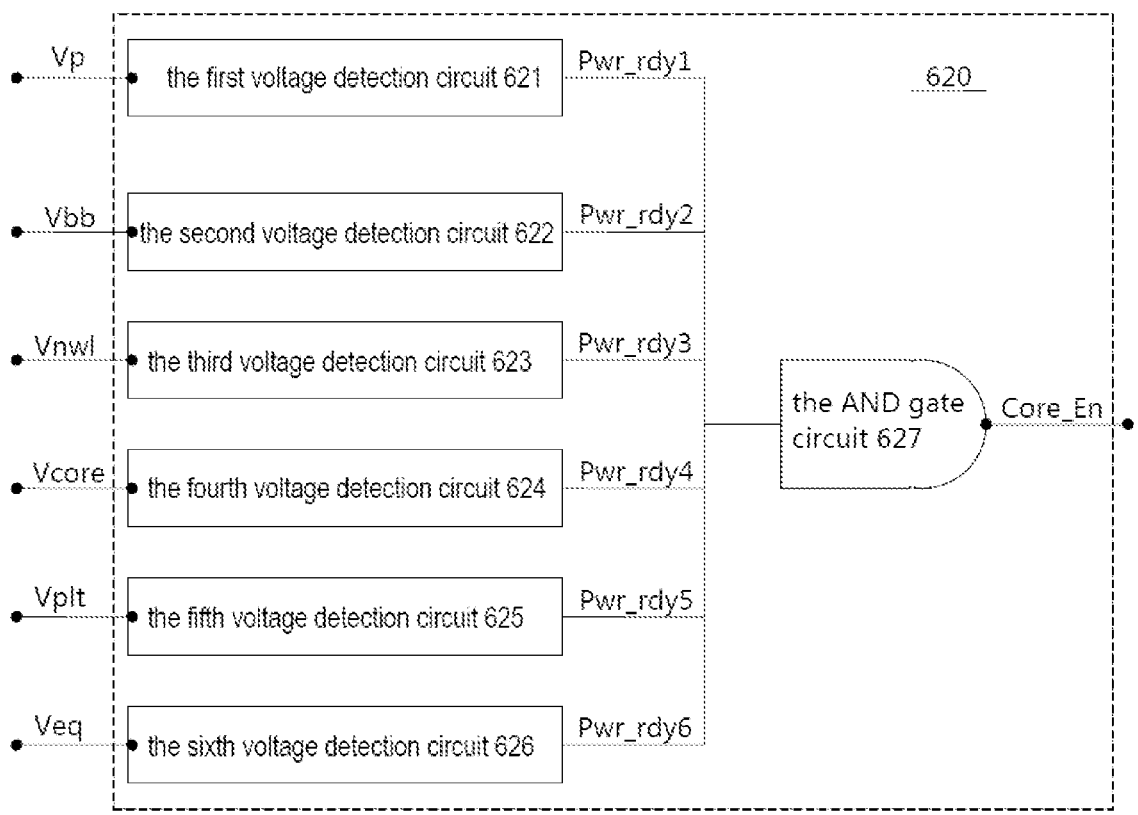
FIG. 8 is a schematic diagram of a die enable circuit based on the power supply system shown in FIG. 6.

FIG. 8 is a schematic diagram of a die enable circuit based on the power supply system shown in FIG. 6.

In some embodiments, the die enable circuit 620 may include: at least one voltage detection circuit configured to detect a corresponding internal voltage, and an AND gate circuit. The input of each of the voltage detection circuits may be connected to a corresponding internal voltage, the output of each voltage detection circuit may be connected to the input of the AND gate circuit, and the output of the AND gate circuit may be configured to output the die enable signal Core-En.

In the embodiment shown in FIG. 8, the die enable circuit 620 may include a first voltage detection circuit 621, a second voltage detection circuit 622, a third voltage detection circuit 623, a fourth voltage detection circuit 624, and a fifth voltage detection circuit 625, and a sixth voltage detection circuit 626. The first voltage detection circuit 621 may be configured to detect the first internal voltage Vp, and output the first detection signal Pwr_rdy1. The second voltage detection circuit 622 may be configured to detect the second internal voltage Vbb, and output the second detection signal Pwr_rdy2. The third voltage detection circuit 623 may be configured to detect the third internal voltage Vnwl and output the third detection signal Pwr_rdy3. The fourth voltage detection circuit 624 can be configured to detect the fourth internal voltage Vcore, and output the fourth detection signal Pwr_rdy4. The fifth voltage detection circuit 625 may be configured to detect the fifth internal voltage Vplt, and output the fifth detection signal Pwr_rdy5. The sixth voltage detection circuit 626 may be configured to detect the sixth internal voltage Veq, and output the sixth detection signal Pwr_rdy6. The first detection signal Pwr_rdy1, the second detection signal Pwr_rdy2, the third detection signal Pwr_rdy3, the fourth detection signal Pwr_rdy4, the fifth detection signal Pwr_rdy5, and the sixth detection signal Pwr_rdy6 may all input to the AND gate circuit 627, and the AND gate circuit 627 may output the die enable signal Core_En.

It should be noted that the number of voltage detection circuits included in the die enabling circuit and the received input signal can be adaptively adjusted according to the type of semiconductor die.

Figure 9:
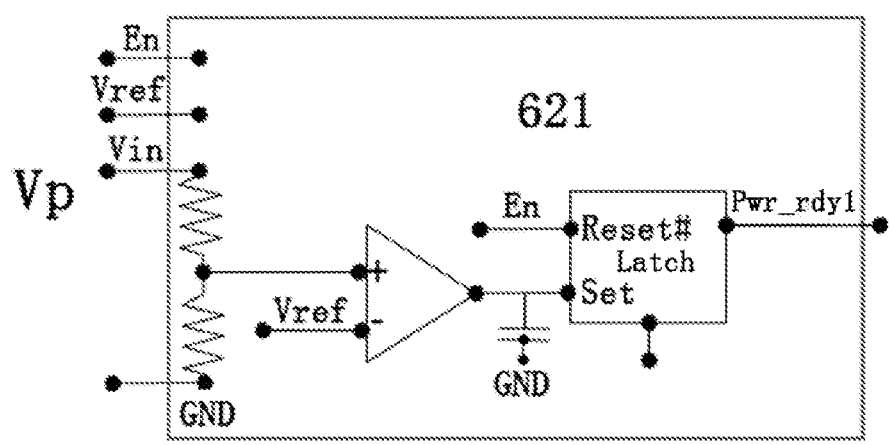
FIG. 9 is a schematic structural diagram of a first voltage detection circuit based on the die enable circuit shown in FIG. 8.

FIG. 9 is a schematic structural diagram of a first voltage detection circuit based on the die enabling circuit shown in FIG. 8.

Using the first voltage detection circuit 621 as an example, FIG. 9 shows a circuit diagram for the voltage detection circuit in FIG. 8. The circuit diagram of the other voltage detection circuits may be the same as the first voltage detection circuit 621 shown in FIG. 9.

The first voltage detection circuit 621 may receive the power enable signal EN and the reference voltage Vref. An input voltage terminal Vin may receive and divide the first internal voltage Vp, and the divided voltage may be sent to a positive input of a comparator, and be compared with the reference voltage Vref on the negative input of the comparator. Then the comparison result may be sent to an input Set of a latch, and the power enable signal EN may be sent to an input Reset of the latch may. The latch may output the first detection signal Pwr_rdy1.

The power supply system and the semiconductor package structure according to the embodiments of the present disclosure may simultaneously provide internal voltages to each of the semiconductor dies in the semiconductor package structure from a same power supply system, and the power supply system does not need to be integrated in any of the individual semiconductor die. Thus, the semiconductor dies can be manufactured by advance fabrication processes, while the power supply system may be manufactured by a regular process. Therefore, on one hand, the efficiency of the power supply system can be improved since the power supply system and the semiconductor dies may each be fabricated by corresponding proper manufacturing processes; and on the other hand, the cost of the DRAM dies fabrication may be reduced as the power supply system does not occupy the die area inside the DRAM dies.

Figure 10:
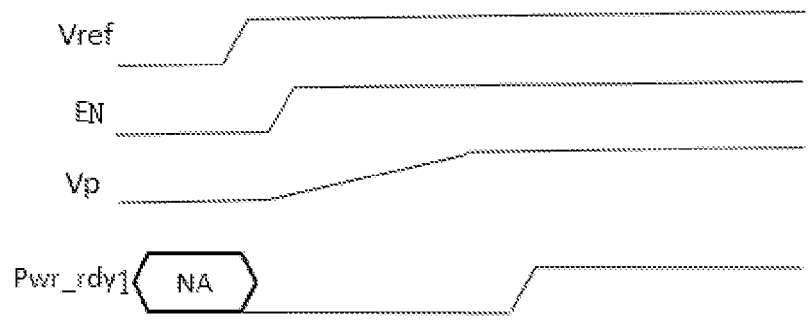
FIG. 10 is a sequence diagram of the first voltage detection circuit shown in FIG. 9.
Figure 11:
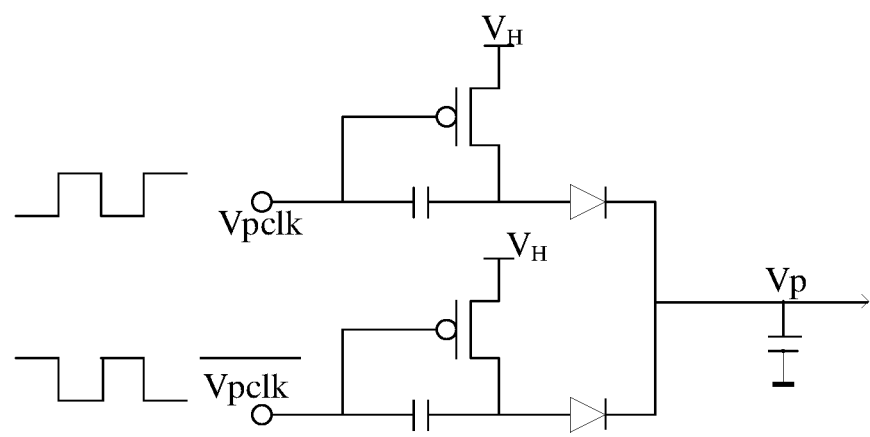
FIG. 11 is a circuit diagram of a charge pump circuit based on the voltage Vp of the power supply system shown in FIG. 6.
Figure 12:
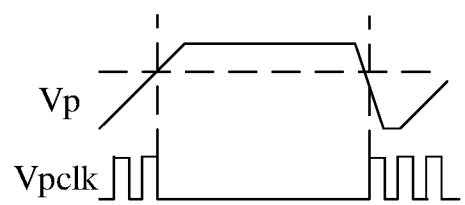
FIG. 12 is a sequence diagram of the charge pump circuit based on the voltage Vp shown in FIG. 11.
Figure 13:
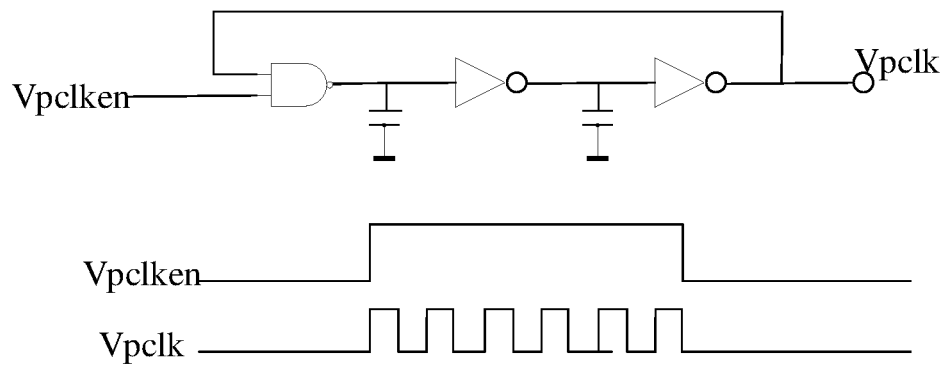
FIG. 13 is a circuit diagram of the generation of the voltage Vpclk shown in FIG. 11.
Figure 14:
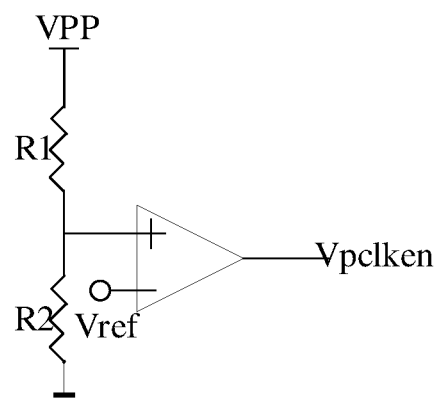
FIG. 14 is a circuit diagram of the generation of the voltage Vpclken shown in FIG. 13.

FIG. 10 is a sequence diagram of the first voltage detection circuit shown in FIG. 9. FIG. 11 is a circuit diagram of a charge pump circuit based on the voltage Vp of the power supply system shown in FIG. 6. FIG. 12 is a sequence diagram of the charge pump circuit based on the voltage Vp shown in FIG. 11. FIG. 13 is a circuit diagram of the generation of the voltage Vpclk shown in FIG. 11. FIG. 14 is a circuit diagram of the generation of the voltage Vpclken shown in FIG. 13.

As shown in FIG. 10, the reference voltage Vref may reach a high level shortly after the voltage Vext is supplied, and the external controller may provide the signal EN to enable the charge pump circuit in FIG. 11 to work (i.e., pump), which may cause the voltage Vp to gradually rise. When the voltage Vp reaches a target voltage, the first voltage detection circuit in FIG. 9 may, after detecting that the voltage Vp has reached the target voltage, generate the first detection signal Pwr_rdy1, indicating that the voltage Vp has reached the target voltage. In FIG. 12, after the voltage Vp reaches the target voltage, the generation of the signal Vpclk may be stopped, causing the charge pump circuit in FIG. 11 to stop working. If the voltage Vp drops below the target voltage, the generation of the voltage Vpclk may begin, causing the charge pump circuit in FIG. 11 to begin working (i.e., pumping).

FIG. 13 shows a voltage Vpclk generating circuit. When the signal Vpclken is at a high level, the generating of the voltage Vpclk starts. When the voltage Vpclken drops to a low level, the generation of the voltage Vpclk stops. FIG. 14 shows a voltage Vpclken generating circuit in which the voltage dividing resistors R1 and R2 can be designed according to specific application scenarios.

Figure 15:
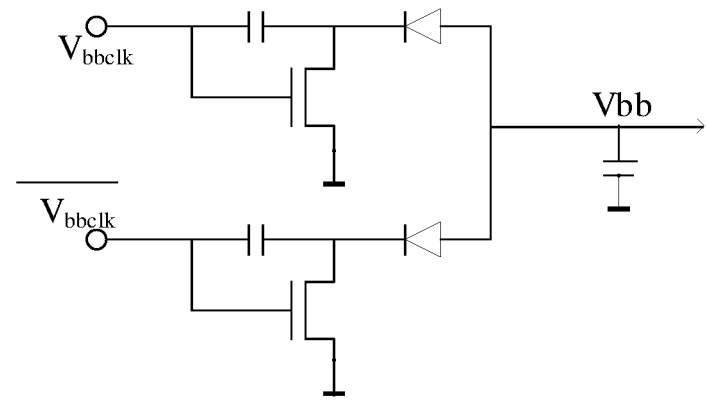
FIG. 15 is a circuit diagram of a charge pump circuit based on the voltage Vbb of the power supply system shown in FIG. 6.
Figure 16:
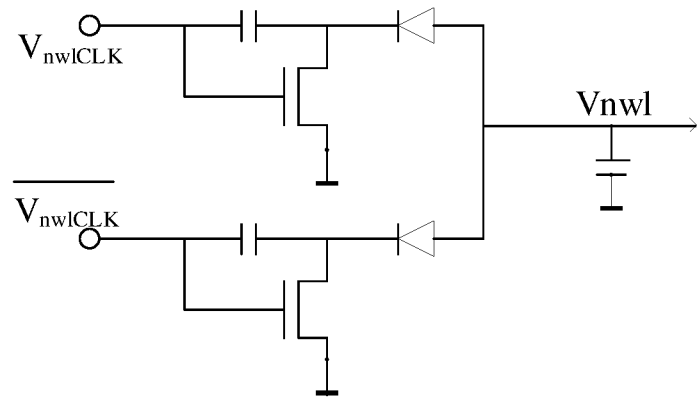
FIG. 16 is a circuit diagram of a charge pump circuit based on the voltage Vnwl of the power supply system shown in FIG. 6.

FIG. 15 is a circuit diagram of a charge pump circuit based on the voltage Vbb of the power supply system shown in FIG. 6. FIG. 16 is a circuit diagram of a charge pump circuit based on the voltage Vnwl of the power supply system shown in FIG. 6. The principle of FIG. 15 and FIG. 16 is substantially the same as that of FIG. 11, and detailed descriptions are omitted for the sake of conciseness.

Figure 17:
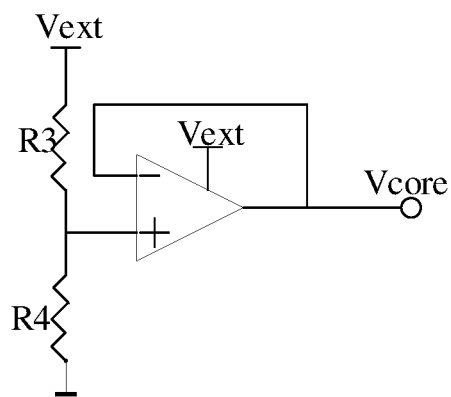
FIG. 17 is a circuit diagram of a low dropout linear regulator based on the voltage Vcore of the power supply system of FIG. 6.
Figure 18:
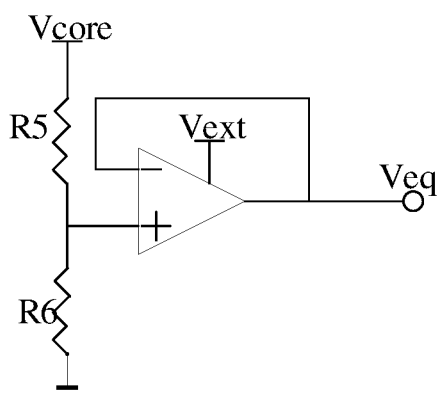
FIG. 18 is a circuit diagram of a low dropout linear regulator based on the voltage Veq of the power supply system of FIG. 6.

FIG. 17 is a circuit diagram of a low dropout linear regulator based on the voltage Vcore of the power supply system shown in FIG. 6. FIG. 18 is a circuit diagram of a low dropout linear regulator based on the voltage Veq of the power supply system shown in FIG. 6.

Taking FIG. 17 as an example, the low dropout linear regulator may have an operational amplifier (OP), a positive input of the OP may be coupled to a voltage resulted from division of the voltage Vext, and the value of the resistors R3 and R4 can be adjusted according to specific application scenarios. The negative input of the OP may be provided with a feedback voltage Vcore, and the voltage Vext supplied to the third input of the OP may be configured for amplification and rectification.

It should be noted that the resistance values of the resistors R3 and R4 may be same or different. Similarly, the resistance values of the voltage dividing resistors R5 and R6 in FIG. 18 may be same or different.

Exemplary embodiments of the power supply system and semiconductor package structure proposed by the present disclosure are described and/or illustrated in detail above. However, embodiments of the present disclosure are not limited to the specific embodiments described herein, but rather, the components and/or steps of each embodiment can be used independently and separately from the other components and/or steps described herein. Each component and/or each step of an embodiment may also be used in combination with other components and/or steps of other embodiments. In the herein description or/and illustration of the elements/components/etc., the terms "one", "the" etc. are used to indicate the presence of one or more elements/components/etc. The terms "comprising", "including" and "having" are used for open-ended mode, which means additional elements/components or the like can also be provided or included in addition to the listed elements/components/etc. Moreover, the terms "first" and "second" and the like in the claims and the description are used only as a mark, not a numerical limit to the corresponding objects.

While the power supply system and the semiconductor package structure according to the present disclosure have been described in terms of various specific embodiments, those skilled in the art will realize that the implementation of the present disclosure can be modified within the spirit and scope of the claims.

The invention claimed is:

1. An electronic device, comprising:
a plurality of semiconductor dies; and
a power supply system, comprising:
a voltage generating circuit configured to generate at least one voltage, wherein the voltage generating circuit comprises at least one voltage regulator configured to generate the at least one voltage; and
a die enable circuit configured to generate a die enable signal according to the at least one voltage, wherein the at least one voltage is provided to the plurality of semiconductor dies through a power interconnecting structure, and the die enable signal is configured to enable synchronous input of the at least one voltage to the plurality of semiconductor dies, wherein the die enable circuit comprises:
at least one voltage detection circuit each configured to detect a corresponding one of the at least one voltage; and
an AND gate circuit, wherein an input of each of the at least one voltage detection circuit is connected to a corresponding one of the at least one voltage, an output of each of the at least one voltage detection circuit is connected to an input of the AND gate circuit, and an output of the AND gate circuit is configured to output the die enable signal.

2. A semiconductor package structure, comprising:
a package substrate; and
the electronic device of claim 1, wherein the power supply system of the electronic device and the plurality of semiconductor dies of the electronic device are disposed on the package substrate.

3. The semiconductor package structure of claim 2, wherein each of the plurality of semiconductor dies having a same electrical function.

4. The semiconductor package structure of claim 3, wherein the plurality of semiconductor dies are memory dies.

5. The semiconductor package structure of claim 4, wherein the plurality of semiconductor dies are dynamic random-access memory (DRAM) dies.

6. The semiconductor package structure of claim 3, wherein the plurality of semiconductor dies are stacked vertically on the power supply system.

7. The semiconductor package structure of claim 6, wherein the power interconnecting structure comprises a through silicon via (TSV).

8. The semiconductor package structure of claim 3, wherein the plurality of semiconductor dies are individually disposed on the package substrate directly, and the power supply system is directly disposed on the package substrate.

9. The semiconductor package structure of claim 3, wherein the plurality of semiconductor dies are vertically stacked on the package substrate, and the power supply system is directly disposed on the package substrate.

10. The semiconductor package structure according to claim 2, wherein a package size of the power supply system is smaller than or equal to a package size of each of the plurality of semiconductor dies.

11. The device of claim 1, wherein the at least one voltage regulator comprises a first charge pump circuit, a second charge pump circuit, a third charge pump circuit, a first low dropout linear regulator, a second low dropout linear regulator, and a third low dropout linear regulator,
wherein the first charge pump circuit, the second charge pump circuit, and the third charge pump circuit are configured to output, respectively, a first voltage, a second voltage, and a third voltage according to an external voltage,
the first low dropout linear regulator, the second low dropout linear regulator, and the third low dropout linear regulator are configured to output, respectively, a fourth voltage, a fifth voltage, and a sixth voltage according to the external voltage,
and wherein the first voltage is larger than the external voltage, and the second voltage and the third voltage are both opposite to the external voltage in polarity, and the fourth voltage, the fifth voltage, and the sixth voltage are each less than or equal to the external voltage.

12. The device of claim 11, wherein the power supply system further comprises:
a reference voltage generating circuit configured to generate a reference voltage,
wherein the at least one voltage regulator are configured to output, respectively, the first voltage, the second voltage, the third voltage, the fourth voltage, the fifth voltage, and the sixth voltage according to the external voltage, the reference voltage, and a power enable signal.

13. The device of claim 1, wherein the at least one voltage regulator comprises a first low dropout linear regulator, a first charge pump circuit, a second charge pump circuit, a second low dropout linear regulator, a third low dropout linear regulator, and a fourth low dropout linear regulator,
wherein the first low dropout linear regulator, the second low dropout linear regulator, the third low dropout linear regulator, and the fourth low dropout linear regulator are configured to output, respectively, a first voltage, a fourth voltage, a fifth voltage, and a sixth voltage according to an external voltage,
the first charge pump circuit and the second charge pump circuit are configured to output, respectively, a second voltage and a third voltage according to the external voltage,
and wherein the first voltage, the fourth voltage, the fifth voltage, and the sixth voltages are each less than or equal to the external voltage, the second voltage and the third voltage are both opposite to the external voltage in polarity.

14. The device of claim 13, wherein the power supply system further comprises:
a reference voltage generating circuit configured to generate a reference voltage,
wherein the at least one voltage regulator are configured to output, respectively, the first voltage, the second voltage, the third voltage, the fourth voltage, the fifth voltage, and the sixth voltage according to the external voltage, the reference voltage, and a power enable signal.

15. An electronic device, comprising:
a plurality of semiconductor dies; and
a power supply system, comprising:
a voltage generating circuit configured to generate at least one voltage, wherein the voltage generating circuit comprises at least one voltage regulator configured to generate the at least one voltage; and
a die enable circuit configured to generate a die enable signal according to the at least one voltage, wherein the at least one voltage is provided to the plurality of semiconductor dies through a power interconnecting structure, and the die enable signal is configured to enable synchronous input of the at least one voltage to the plurality of semiconductor dies,
wherein the at least one voltage regulator comprises a first charge pump circuit, a second charge pump circuit, a third charge pump circuit, a first low dropout linear regulator, a second low dropout linear regulator, and a third low dropout linear regulator,
wherein the first charge pump circuit, the second charge pump circuit, and the third charge pump circuit are configured to output, respectively, a first voltage, a second voltage, and a third voltage according to an external voltage,
the first low dropout linear regulator, the second low dropout linear regulator, and the third low dropout linear regulator are configured to output, respectively, a fourth voltage, a fifth voltage, and a sixth voltage according to the external voltage,
and wherein the first voltage is larger than the external voltage, and the second voltage and the third voltage are both opposite to the external voltage in polarity, and the fourth voltage, the fifth voltage, and the sixth voltage are each less than or equal to the external voltage.

16. The device of claim 15, wherein the power supply system further comprises:
a reference voltage generating circuit configured to generate a reference voltage,
wherein the at least one voltage regulator are configured to output, respectively, the first voltage, the second voltage, the third voltage, the fourth voltage, the fifth voltage, and the sixth voltage according to the external voltage, the reference voltage, and a power enable signal.

17. A semiconductor package structure, comprising:
a package substrate; and
the electronic device of claim 15, wherein the power supply system of the electronic device and the plurality of semiconductor dies of the electronic device are disposed on the package substrate.

18. An electronic device, comprising:
a plurality of semiconductor dies; and
a power supply system, comprising:
a voltage generating circuit configured to generate at least one voltage, wherein the voltage generating circuit comprises at least one voltage regulator configured to generate the at least one voltage; and
a die enable circuit configured to generate a die enable signal according to the at least one voltage, wherein the at least one voltage is provided to the plurality of semiconductor dies through a power interconnecting structure, and the die enable signal is configured to enable synchronous input of the at least one voltage to the plurality of semiconductor dies, wherein the at least one voltage regulator comprises a first low dropout linear regulator, a first charge pump circuit, a second charge pump circuit, a second low dropout linear regulator, a third low dropout linear regulator, and a fourth low dropout linear regulator, wherein the first low dropout linear regulator, the second low dropout linear regulator, the third low dropout linear regulator, and the fourth low dropout linear regulator are configured to output, respectively, a first voltage, a fourth voltage, a fifth voltage, and a sixth voltage according to an external voltage, the first charge pump circuit and the second charge pump circuit are configured to output, respectively, a second voltage and a third voltage according to the external voltage, and wherein the first voltage, the fourth voltage, the fifth voltage, and the sixth voltages are each less than or equal to the external voltage, the second voltage and the third voltage are both opposite to the external voltage in polarity.

19. The device of claim 18, wherein the power supply system further comprises:

a reference voltage generating circuit configured to generate a reference voltage, wherein the at least one voltage regulator are configured to output, respectively, the first voltage, the second voltage, the third voltage, the fourth voltage, the fifth voltage, and the sixth voltage according to the external voltage, the reference voltage, and a power enable signal.

20. A semiconductor package structure, comprising:

a package substrate; and the electronic device of claim 18, wherein the power supply system of the electronic device and the plurality of semiconductor dies of the electronic device are disposed on the package substrate.

\* \* \* \* \*